United States Patent
Mann et al.

(10) Patent No.: US 7,429,116 B2
(45) Date of Patent: Sep. 30, 2008

(54) PROJECTION OBJECTIVE AND METHOD FOR ITS MANUFACTURE

(75) Inventors: Hans-Juergen Mann, Oberkochen (DE); Stephan Muellender, Aalen (DE); Johann Trenkler, Schwaebisch Gmuend (DE); Hartmut Enkisch, Aalen (DE)

(73) Assignee: Carl Zeiss SMT AG, Oberkochen (DE)

( * ) Notice: Subject to any disclaimer, the term of this patent is extended or adjusted under 35 U.S.C. 154(b) by 169 days.

(21) Appl. No.: 11/014,537

(22) Filed: Dec. 16, 2004

(65) Prior Publication Data

US 2005/0134980 A1 Jun. 23, 2005

(30) Foreign Application Priority Data

Dec. 19, 2003 (DE) ................. 103 60 414

(51) Int. Cl.
*G02B 7/182* (2006.01)
(52) U.S. Cl. .................. 359/871; 359/900; 378/34; 702/188
(58) Field of Classification Search ................ 359/871, 359/900; 378/34; 702/188
See application file for complete search history.

(56) References Cited

U.S. PATENT DOCUMENTS

| | | | |
|---|---|---|---|
| 5,757,017 A | 5/1998 | Braat | |
| 6,247,818 B1 | 6/2001 | Hedblom et al. | |
| 6,266,389 B1 | 7/2001 | Murayama et al. | |
| 6,312,373 B1 | 11/2001 | Ichihara | |
| 6,353,470 B1 | 3/2002 | Dinger | |
| 6,639,651 B2 * | 10/2003 | Matsuyama | 355/52 |
| 6,727,980 B2 | 4/2004 | Ota et al. | 355/55 |
| 7,283,204 B2 * | 10/2007 | Wegmann | 355/67 |
| 2002/0171922 A1 | 11/2002 | Shiraishi et al. | |
| 2002/0183977 A1 * | 12/2002 | Sui et al. | 702/188 |
| 2003/0081722 A1 | 5/2003 | Kandaka et al. | 378/70 |
| 2004/0112866 A1 * | 6/2004 | Maleville et al. | 216/83 |

FOREIGN PATENT DOCUMENTS

| | | |
|---|---|---|
| JP | 2000-321027 | 11/2000 |
| JP | 2000-321028 | 11/2000 |
| JP | 2000-321029 | 11/2000 |
| JP | 2000-321031 | 11/2000 |
| JP | 2000-321039 | 11/2000 |

* cited by examiner

*Primary Examiner*—Joshua L Pritchett
(74) *Attorney, Agent, or Firm*—Young Basile, P.C.

(57) ABSTRACT

A method of manufacturing a projection objective (22) of a microlithographic projection exposure apparatus (10). The projection objective (22) comprises at least one mirror (M1 to M6) that each have a mirror support (241 to 246) and a reflective coating (26) applied thereon. First imaging aberrations of a pre-assembled projection objective are measured. Before the coating (26) is applied, the mirror supports (241 to 246) are provided with a desired surface deformation (34). If the mirrors (M1 to M6) are not reflective for projection light without the coating (26), measuring light is used that has another wavelength. Alternatively, two identical mirror supports (246) may be provided. One support having a reflective coating is part of the pre-assembled projection objective whose imaging aberrations are measured. The other support is provided with surface deformations before coating and mounting the support into the objective.

11 Claims, 4 Drawing Sheets

PROJECTION OBJECTIVE AND METHOD FOR ITS MANUFACTURE

BACKGROUND OF THE INVENTION

1. Field of the Invention

The invention quite generally relates to projection objectives of microlithographic projection exposure apparatus, which have at least one mirror with a mirror carrier and a reflective coating applied thereon. In particular, the invention relates to EUV projection objectives that use projection light with a wavelength in the extreme ultraviolet spectral range (EUV).

2. Description of Related Art

Microlithographic projection exposure apparatus, as used for manufacturing integrated electrical circuits and other micro-structured components, reproduce structures, which are contained in a reticle, generally reduced on a photo-sensitive layer that can be applied on a silicon wafer for example.

One of the main aims in the development of projection exposure apparatus consists of being able to lithographically define structures with increasingly smaller dimensions on the photo-sensitive layer. The production of particularly small structural sizes requires a low resolution of the projection objectives. Since the resolution of the projection objectives is proportional to the wavelength of the projection light, successive generations of such projection exposure apparatus use projection light with ever shorter wavelengths. Future projection exposure apparatus still presumably use projection light with a wavelength which lies in the extreme ultraviolet spectral range (EUV). To be considered here are in particular wavelengths between 1 nm and 30 nm and more particularly the wavelength 13.5 nm When using projection light with such short wavelengths, no sufficiently transparent materials are available for manufacturing lenses and other refractive optical elements. Therefore EUV projection objectives are substantially composed of mirrors. The mirrors consist of a mirror support, which for example can be manufactured from a glass blank and which has a surface that is manufactured with high precision. Since the mirror support for the projection light is almost 100% absorbent and therefore does not reflect any projection light, a reflective coating with a reflectivity in the order of approximately 60% to 70%, is applied on the surface that is exposed to the projection light.

Coated mirrors however are also used in projection objectives that are designed for longer wavelengths. In order to avoid chromatic aberrations, for example, projection objectives that are suitable for the wavelength 157 nm frequently have a catadioptric structure. This means that they also contain at least one mirror as well as refractive optical elements such as lenses.

Due to the small size of the structures to be reproduced, high demands are made on the reproduction properties of the projection objective. Aberrations can therefore only be tolerated to an absolute minimum.

Generally aberrations are divided into the following two categories. On the one hand there are aberrations which result from the design of the projection objective, i.e. from the specification of the dimensions, materials and distances of the optical elements contained in the projection objective. These design errors will not be regarded in the following.

On the other hand there are aberrations that are due to manufacturing or material defects and generally can only be corrected properly on the completed projection objective. In the case of mirrors for projection objectives form errors represent the most important manufacturing defects. The term "form error" relates quite generally to deviations of an actual optical surface from its desired form In order to correct such manufacturing- or material-related aberrations, U.S. Pat. No. 6,266,389 B1 proposes, in connection with an EUV projection objective, that the finally assembled and adjusted projection objective is measured and then the surface of one or several mirrors is reprocessed in such a way that certain imaging properties of the projection objective are improved. Here, the reprocessing takes place in such a manner that material is removed locally from the coating of the mirrors and/or material is applied locally by laminating onto the coating.

However, it has been shown that the reflectivity of the coating as a result of the local reprocessing substantially changes—and to be more precise—generally decreases. Although the known manufacturing process allows to reduce wavefront errors, the uniformity of the light intensity distribution in the image plane of the projection objective may, to an intolerable extent, deteriorate due to the locally altered reflectivities of individual mirrors.

SUMMARY OF THE INVENTION

It is an object of the present invention to provide an improved method of manufacturing EUV projection objectives comprising a plurality of mirrors.

It is a further object of the present invention to provide an improved method of manufacturing EUV projection objectives that allows to reduce manufacturing-related aberrations without significantly changing the reflectivity of the mirrors.

This and other objects of the invention are achieved, according to a first aspect of the invention, by a method comprising the following steps:

a) providing a mirror support for the at least one mirror:

b) assembling and adjusting the optical elements including the mirror support for the at least one mirror into a housing of the projection objective;

c) obtaining measured data relating to at least one image property of the projection objective using measuring light, d) comparing the measured data with desired values;

e) defining a surface deformation on the mirror support of the at least one mirror such that an improvement of the at least one image property can be achieved;

f) producing the surface deformation defined in step e) on the surface of the mirror support;

g) applying the coating onto the surface, which has been reprocessed in step f), of the mirror support;

h) assembling the mirror support coated in step g) into the housing.

According to a second aspect of the invention the above stated object is achieved by a method comprising the following steps:

a) providing a master mirror support for the at least one mirror;

b) providing a substantially identical copy of the master mirror support;

c) applying the coating onto the master mirror support;

d) assembling and adjusting the optical elements including the master mirror support coated in step c) into a housing of the projection objective;

e) obtaining measured data relating to at least one image property of the projection objective;

f) comparing the measured data with ideal values;

g) defining a surface deformation on the mirror support of the at least one mirror such that an improvement of the at least one image property can be achieved;

h) producing the surface deformation defined in step g) on the copy of the mirror support;

i) applying the coating onto the copy of the mirror support reprocessed in step h);

j) replacing the mirror support assembled in step d) into the housing by its copy coated in step i).

In this context local aspheric deformations of the surface in the nanometer and sub-nanometer range will be referred to in short as "surface deformations". In the literature such surface deformations are also referred to as "nanometer aspheres", see, for example, the essay of C. Hofmann et al. entitled "Nanometer Aspären: Wie herstellen und wofür?", Feinwerktechnik und MeBtechnik 99(19919, 10), pages 437 to 440, which however refer to the reprocessing of lenses and other refractive optical elements.

Thus, in accordance with the invention it is not the sensitive coating of one or several mirrors, which is reprocessed in order to improve the imaging properties, but always the uncoated mirror support. Therefore no local removal of the coating, which could reduce the reflectivity of the coating, takes place.

Since the surface deformation is produced before the coating is applied onto the mirror support, there is also no necessity to partly again remove a coating, which is already applied, in order to produce the desired surface deformation on the then exposed area on the surface of the mirror support and subsequently to again cover this area with a new coating.

In the case of EUV projection objectives, the uncoated mirror supports reflect practically no projection light at all. Therefore with EUV projection objectives the measurement is performed according to the first aspect of the invention with another, preferably longer wavelength, in which case the mirror supports also have such high reflectivity so as to facilitate measurement of the projection objective. In the case of catadioptric projection objectives, which are designed for projection light having a longer wavelength, the projection light itself may also be used for measurement.

According to the second aspect of the invention, the measurement of the projection objective is performed with the later used projection light with the mirror support being coated. Then, however, not a mirror that is assembled in the measured projection objective is reprocessed, but a still uncoated, substantially identical copy of the same. This copy should correspond as accurately as possible with the measured mirror. Since, however, due to manufacturing tolerances no mirrors can be made that are perfectly identical with mathematical accuracy, the copy can only be substantially identical to the measured mirror.

Preferably not several mirrors, but just a few or even only one mirror are reprocessed on the surface of the mirror supports for the correction of aberrations. In the case of the first aspect of the invention that preferably uses measuring light Faith a wavelength other than the later used projection light, therefore all mirrors, which are not to be subjected to later reprocessing, can already be provided with the coating before the measurement. This is particularly advantageous, since then only the mirror or mirrors to be reprocessed have to be removed from the projection objective after the measurement and reassembled into the projection objective after being reprocessed and coated. The ideal values, with which the measured data obtained during the measurement are compared, are therefore to be determined depending on which of the mirrors assembled into the projection objective support a coating.

Of course, it also is possible in this context to reprocess and re-assemble into the projection objective a substantially identical copy of an uncoated mirror support that has been assembled into the projection objective during the measurement.

If, in accordance with the second aspect, the surface deformation is produced on a substantially identical copy of the measured coated mirror support, systematic errors, as they arise for example in optical testing facilities for checking the dimensional accuracy of surface deformations produced, can therefore be compensated, since these systematic errors occur with the master mirror supports in the same way as with their copies.

BRIEF DESCRIPTION OF THE DRAWINGS

Various features and advantages of the present invention may be more readily understood with reference to the following detailed description taken in conjunction with the accompanying drawing in which.

DESCRIPTION OF PREFERRED EMBODIMENTS

Figure 1:
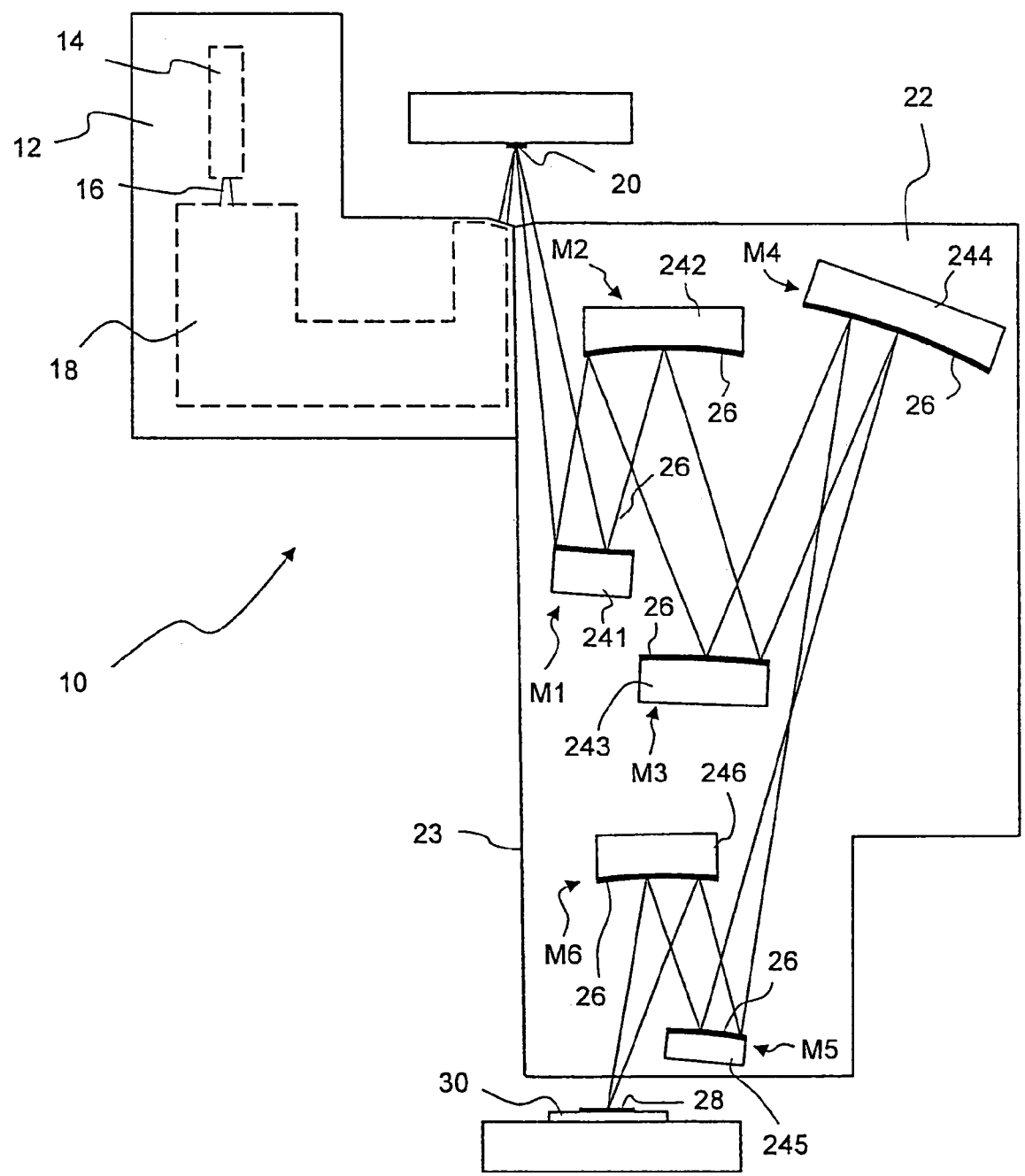
FIG. 1 is a schematic illustration of a projection objective in accordance with the invention in a meridional section.

In FIG. 1 a microlithographic projection exposure apparatus is illustrated in a very schematized and not to-scale meridian section and designated in its entirety by the reference numeral 10. The projection exposure apparatus 10 comprises an illumination system 12, in Which a light source 14 is arranged. The light source 14 serves to generate projection light, Which is indicated by 16 and has a wavelength in the extreme ultraviolet spectral range, for example 13.5 nm In addition, illumination optics only indicated by 18 are part of the illuminations system 12 that allow to direct the projection light 16 onto a reticle 20. The illumination device 12 is known as such in the prior art, for example from EP 1 123 1 95 A1, and is therefore not described here in more detail.

The projection light 16 reflected by the reticle 20 enters a projection objective 22, which in the embodiment illustrated, contains 6 aspheric projecting mirrors M1, M2, . . . , M6 arranged in a housing 23. Each of the mirrors M1 to M6 has a mirror support 241, 242, . . . , 245 and/or 246, onto which a coating 26 is applied. The coatings 26 can be different from mirror to mirror and may comprise, for example, alternating successions of thin molybdenum and silicon layers. Such layered structures can reflect more than 60% of the impinging projection light 16. However, other laminated structures known in the prior art may also be used.

After reflection from the mirrors M1 to M6, the projection light 16 impinges on a layer 28 that is deposited onto a silicon wafer 30 and is sensitive to light of the particular wavelength. Thus a reduced image of the structures contained in the reticle 20 is produced on the layer 28. Since the fundamental arrangement of the mirrors M1 to M6 in the projection objective 22 is known as such in the prior art, for example from U.S. Pat. No. 6,353,470 B1, explanation of further details in this regard is dispensed with.

The mirror supports 241 to 246 consist of a material that can be processed with high precision and preferably possesses low thermal coefficients of expansion. Titanium-enriched quartz glass, for example, is possible in this context, and in particular ULE®, whereby ULE stands for "ultra low expansion" and is a registered trademark of the CORNING Company in the USA. In addition, certain glass ceramics such as for instance ZERODUR® (registered trademark of the Schott Glass Company, Germany) are suitable material for the mirror supports 241 to 246. ZERODUR® is a two-phase material having a crystalline phase that contracts with a rise in temperature and an amorphous phase that expands with a rise in temperature. The temperature dependence of the thermal coefficients of expansion can be very exactly adjusted by selecting the mixing ratio of the two phases.

Figure 2:
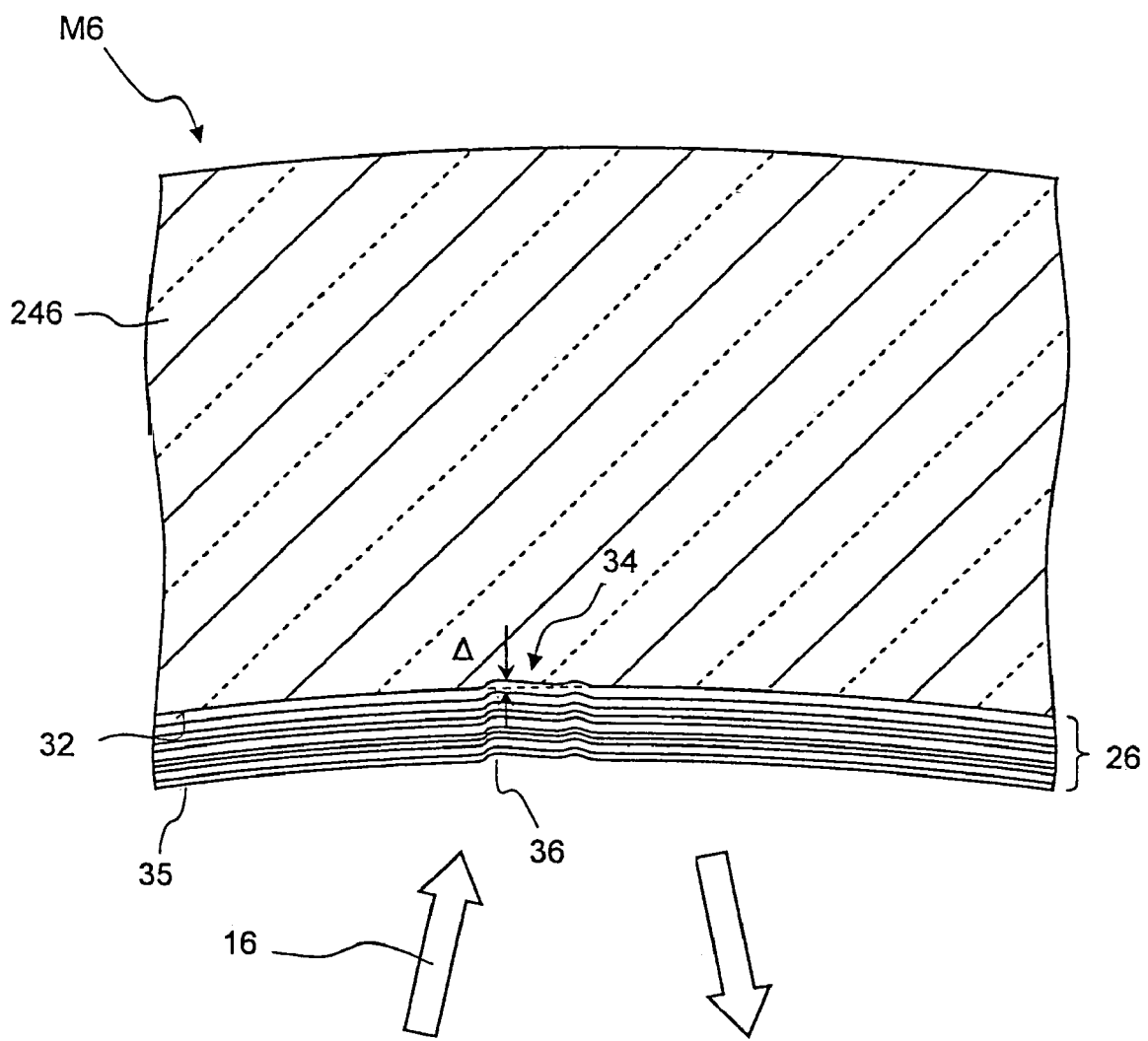
FIG. 2 is an enlarged, not to-scale cutout from one of the mirrors in a sectional view.

FIG. 2 shows a cutout from the last mirror M6 on the image-side in an enlarged, not to-scale sectional view. In the sectional view it can be seen that the coating 26, which is applied onto the optically active surface 32 of the mirror support 246, consists of a plurality of thin single layers as described above. Real layer systems can contain substantially more single layers than is illustrated in FIG. 2 for reasons of clarity.

A deformation on the surface 32 of the mirror support 246 is designated by 34, which was produced by way of subsequent removal of material from the otherwise uniformly curved surface 32. The maximum depth Δ of the surface deformation 34 lies in the order of magnitude of several angstroms or a few nanometers. The layers of the coating 26 track the pattern of the surface deformation 34 without substantially changing their thickness. Thus, the surface deformation 34 continues, at least to a certain extent, as far as the outermost layer 35 of the coating 26 and forms a recess 36 at the outer surface. The form of this recess substantially corresponds to the surface deformation 34.

Since the surface deformation 34 on the surface 32 of the mirror support 246 transfers to the coating 26, the wavefront of the impinging projection light 16 is systematically affected in its phase. The shape of the surface deformation 34 is defined such that wavefront phase changes caused in the coating 26 correct at least partly aberrations of the projection objective 22. Since no material is removed from the coating 26 and thus all single layers also have their ideal thickness in the proximity of the recess 36, the reflectivity of the portion of the coating 26 above the surface deformation 34 is not changed.

Figure 3:
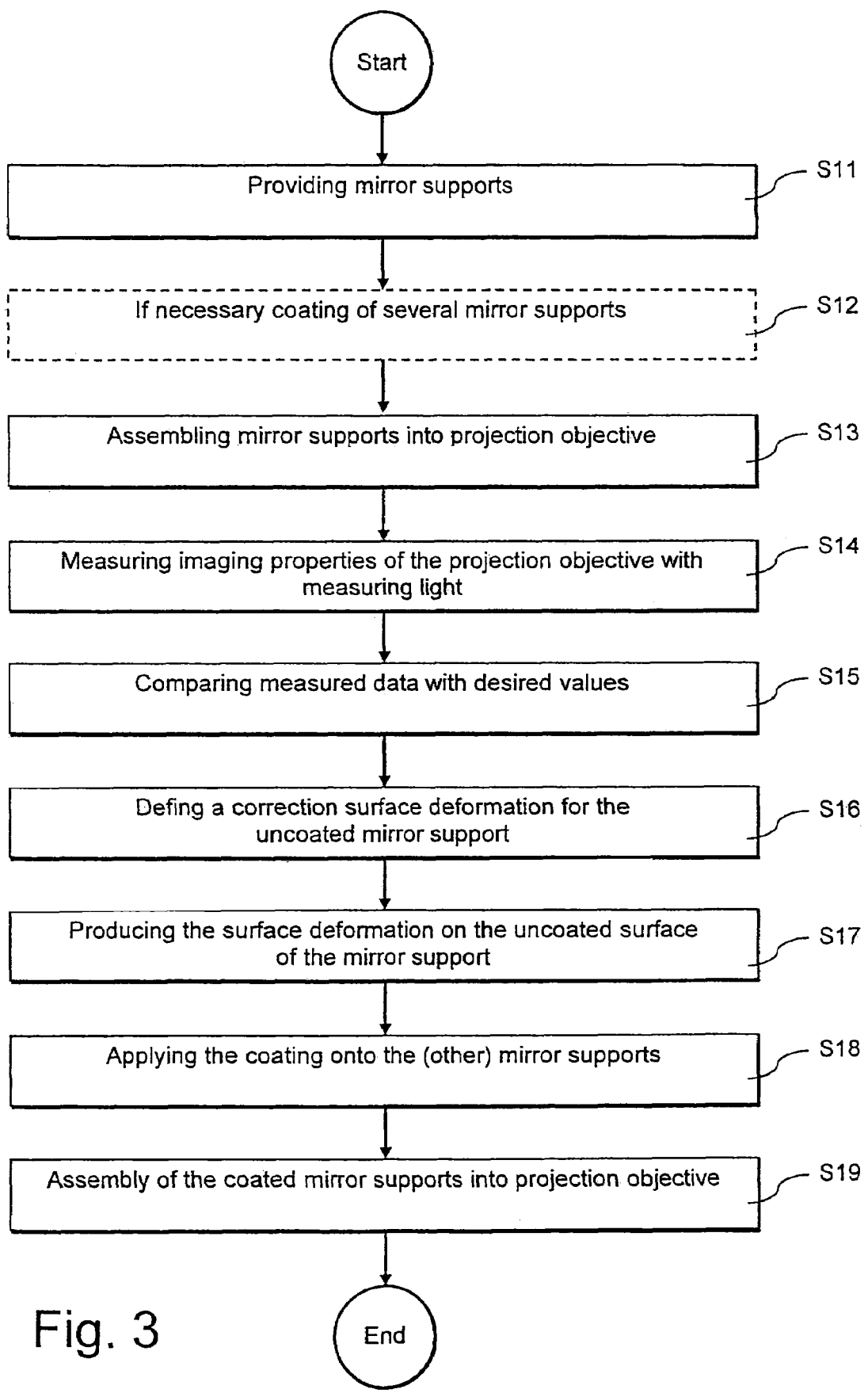
FIG. 3 is a flow chart for explanation of a first embodiment of the invention.

In the following a first embodiment of a method to manufacture the projection objective 22 illustrated in FIGS. 1 and 2 will be described with reference to the flow chart shown in FIG. 3:

First, in a step S11, the six mirror supports 241 to 246 are provided.

Then, in a step S12, the mirror supports 241 to 245 of the mirrors M1 to M5 are provided with the coating 26. The mirror support 246 remains uncoated.

In a step S13 all mirror supports, i.e. both the coated mirror supports 241 to 245 as well as the still uncoated mirror support 246, are assembled and adjusted into the projection objective 22.

In a step S14 certain optical properties of the projection objective 22 are measured. The measurement in this case can be performed in the same way, as is known for instance from U.S. Pat. No. 6,266,389 B1 that has already been mentioned above. In contrast to the process described there, however, a special measuring light is used having a wavelength that is selected in such a manner that the still uncoated mirror support 246 also reflects the measuring light. For this purpose measuring light with a wavelength of several hundred nanometers, e.g. 365 nm or 248 nm, may be used. The illumination device 12 is, during the measurement, interchanged with another illumination device that generates light with the desired wavelength directs the projection light into the projection objective 22. With the aid of interferometric measuring instruments that are known as such, the wavefront aberrations of the projection objective 22 are measured.

The measured wavefront is compared in a further step S15 with ideal values, as they have been determined previously for the design of the projection objective 22. With regard to this determination it is to be considered that the measuring light has a longer wavelength than the light used later on during the exposure process. Although the optical path in the projection objective 22 is independent of the wavelength of the light reflected from the mirrors M1 to M6 in first approximation, the reflection on the mirrors M1 to M6 may be different for the measuring light and for the EUV radiation. This is because the measuring light does not penetrate the coating 26 of the mirrors M1 to M6, but is almost totally reflected from their outer surface pointing outwards. Thus, the coated mirrors M1 to M5 appear translatorily slightly offset when exposed to the measuring light.

In a step S16 a surface deformation 34 for the still uncoated mirror support 246 is computed on the basis of the comparison between measured data and ideal values according to step S15. This computation is performed in such a manner that a pre-defined imaging property of the projection objective is improved. Computations of this type are known in the prior art, see, for example, U.S. Pat. No. 6,266,281 B1 that has already been mentioned and whose full disclosure is incorporated by reference.

In a step S17 the surface deformation 34 defined in the step S16 is produced in any known way, on the mirror support 246 that has been previously dismounted from the projection objective 22. For this purpose, material may locally be removed by reactive ion beam etching, for example.

The surface 32 of the mirror support 246 reprocessed in such a way is provided with the coating 26 in a step S18. As a result, the mirror M6 receives the structure shown in FIG. 2.

The coated mirror support 246 is subsequently re-assembled and adjusted into the projection objective 22 in a step S19. After final fine adjustment using the projection light, the projection objective 22 is completed.

In modification of the afore-described manufacturing method, all mirror supports 241 to 246 are assembled and adjusted into the projection objective 22 without preceding coating (step S13). The step S12, in which at least some of the mirror supports 241 to 246 are coated, is therefore not necessary. In the step S18 not only the reprocessed mirror support 246, but also all remaining mirror supports 241 to 245, which have not been reprocessed, are then coated. A disadvantage of this variant is that the mirror supports 241 to 245 that have not been reprocessed have to be dismounted from the projection objective 22 after the initial assembly into objective 22 in the step S13, and theses supports 241 to 245 have to be assembled again into the projection objective 22 afterwards.

On the other hand, this variant has the advantage that it is not necessary to determine before the measurement of the projection objective 22 which mirror supports 241 to 246 should be reprocessed on their surface 32. Although there are generally certain mirrors inside the projection objectives 22 that are particularly suitable for producing surface deformations that correct aberrations, however, depending on the type of manufacturing defects it may sometimes be expedient produce surface deformations 34 on other or even on all mirror supports 241 to 246.

Figure 4:
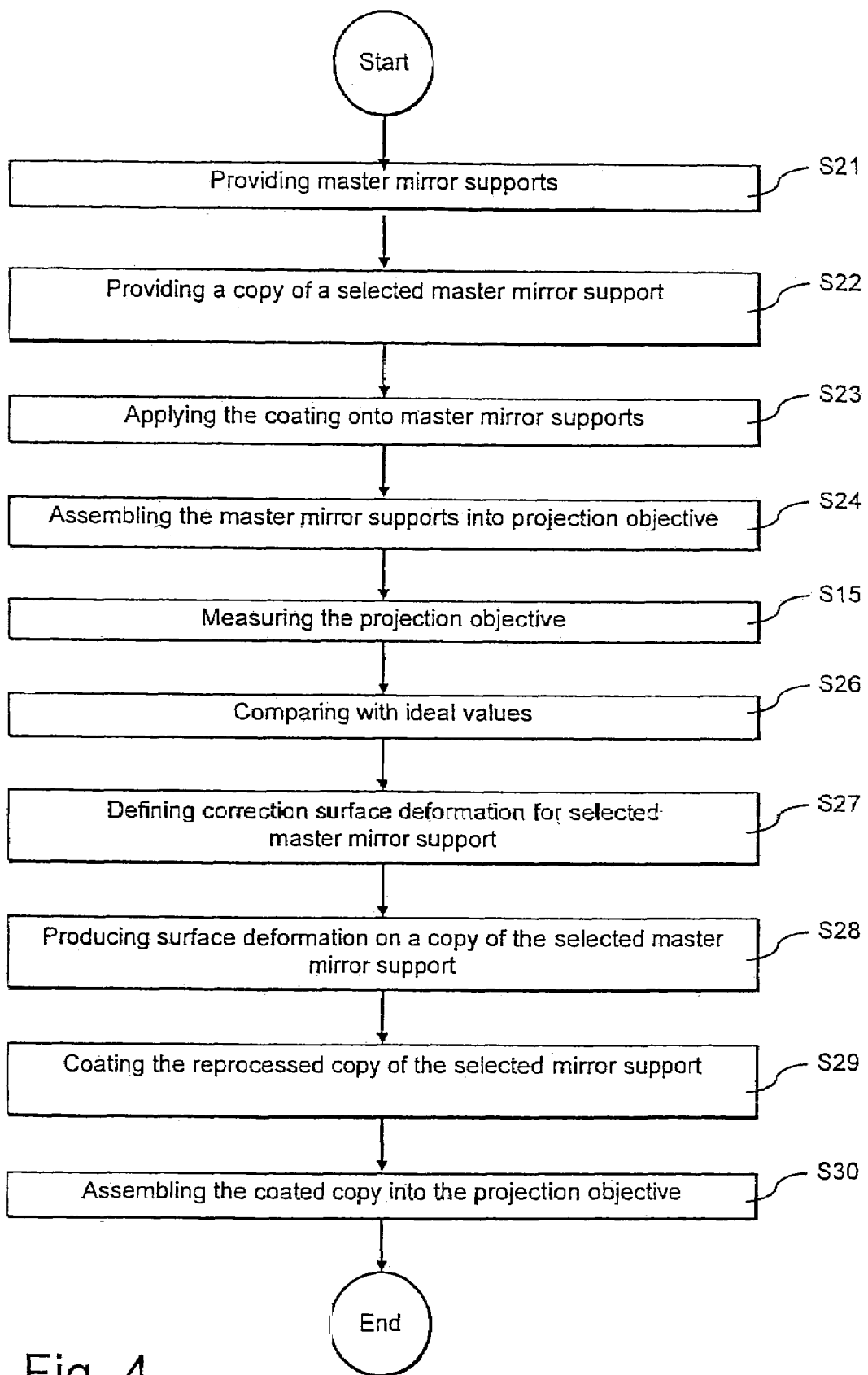
FIG. 4 is a flow chart for explanation of a second embodiment of the invention.

In the following another embodiment of a method for manufacturing the projection objective 22 shown in FIGS. 1 and 2 is described on the basis of the flow chart shown in FIG. 4.

The manufacturing process likewise begins with the provision of mirror supports 241 to 246 in a step S21.

While for the mirrors M1 to M5 in each case only a single mirror support 241, 242, 243, 244 and/or 215 is made, for the mirror M6 two mirror supports 246 are made that are as identical as possible. In order to be able to distinguish between these, the first complete set of mirror supports 241, 246 is referred to as master mirror supports in the following, while the additional one mirror support for the mirror M6 is referred to as a copy of the master mirror support 246.

In a step S23 the coating 26 is applied onto each of the master mirror supports 241 to 246.

In a step S24 the master mirror supports 241 to 246 are assembled and adjusted into the projection objective 22.

In a step S25 the projection objective 22, completed to this extent, is measured in the same way as discussed above with reference to the step S14. Alternatively, projection light may also be used as measuring light, since all mirrors M1 to M6 are provided with the highly reflective coating 26.

After a comparison of the measured data with corresponding ideal values in a step S26, a surface deformation 34 is defined in a step S27 so that the imaging properties of the projection objective 22 are improved.

This surface deformation 34, however, is now produced in a step S28 not on the master mirror support 246 of the mirror M6, but on the still uncoated copy of this master mirror support 246. The copy reprocessed in such a manner is then provided with the coating 26 in a step S29 so that the mirror M6 receives the configuration shown in FIG. 2.

In a step S30 the original mirror M6 with the master mirror support 246 is replaced by the reprocessed and coated copy of this mirror support. The projection objective 22 completed after final adjustment now has a mirror M6 with a surface deformation 34, as is illustrated in FIGS. 1 and 2.

It is to be pointed out that although the afore-described invention is particularly suitable for EUV projection objectives, in principle it may also be used for the manufacture of projection objectives that are designed for longer wavelengths of 365 nm, 248 nm, 193 nm or 157 nm, for example.

The invention claimed is:

1. A method of manufacturing a projection objective of a microlithographic projection exposure apparatus having several optical elements, wherein at least one optical element is a mirror comprising a mirror support, said method comprising the following steps:
   a) providing an uncoated mirror support for the at least one mirror;
   b) assembling and adjusting the optical elements including the uncoated mirror support for the at least one mirror into a housing of the projection objective;
   c) obtaining measured data relating to at least one image property of the projection objective using measuring light;
   d) comparing the measured data with desired values;
   e) defining a surface deformation for the uncoated mirror support such that an improvement of the at least one image property can be achieved;
   f) producing the surface deformation defined in step e) on a surface of the uncoated mirror support;
   g) applying the coating onto the uncoated mirror support surface which has been reprocessed in step f); and
   h) assembling the mirror support coated in step g) into the housing.

2. The method of claim 1, wherein the uncoated mirror support reprocessed in step f) and coated in step g) is an identical copy of the mirror support that is assembled into the projection objective in step b).

3. The method of claim 1, wherein the ideal values are determined under consideration of the wavelength of the measuring light.

4. The method of claim 1, wherein the projection objective contains several mirrors.

5. The method of claim 4, wherein at least one, but not all mirror supports are provided with a coating before obtaining the measured data in step c).

6. The method of claim 4, wherein surface deformations are produced according to step f) on more than one uncoated mirror support.

7. The method of claim 4, wherein a surface deformation is produced according to step f) on only one uncoated mirror support.

8. The method of claim 1, wherein the measuring light has a wavelength that is different from the projection light for which the projection objective is designed.

9. A method of manufacturing a projection objective of a microlithographic projection exposure apparatus having several optical elements, the method comprising the steps of:
   a) providing at least one uncoated mirror support;
   b) assembling and adjusting the optical elements and the uncoated mirror support into a housing of the projection objective;
   c) obtaining measured data relating to at least one image property of the projection objective using measuring light while the optical elements and uncoated mirror support are positioned in the housing;
   d) comparing the measured data with desired values;
   e) determining a surface deformation for the uncoated mirror support such that an improvement of the at least one image property can be achieved;
   f) generating the determined surface deformation on the surface of the uncoated mirror support;
   g) applying a reflective coating onto the deformed reprocessed surface defining a mirror; and
   h) installing the mirror into the housing.

10. The method of claim 9 wherein the reflective coating applied in step g) is not reprocessed.

11. The method of claim 9 further comprising the step of applying a reflective coating to at least one of the optical elements assembled in step b).

* * * * *